US011953392B1

(12) United States Patent
Liu

(10) Patent No.: US 11,953,392 B1
(45) Date of Patent: Apr. 9, 2024

(54) PACKAGING STRUCTURE AND METHOD OF MEMS PRESSURE SENSOR

(71) Applicant: Wuxi Sencoch Semiconductor Co., Ltd., Jiangsu (CN)

(72) Inventor: Tongqing Liu, Jiangsu (CN)

(73) Assignee: Wuxi Sencoch Semiconductor Co., Ltd., Wuxi (CN)

( * ) Notice: Subject to any disclaimer, the term of this patent is extended or adjusted under 35 U.S.C. 154(b) by 0 days.

(21) Appl. No.: 18/370,897

(22) Filed: Sep. 21, 2023

(30) Foreign Application Priority Data

Sep. 21, 2022 (CN) .......................... 202211151572.0
Sep. 21, 2022 (CN) .......................... 202211151573.5

(51) Int. Cl.
*G01L 9/06* (2006.01)
*B81B 7/00* (2006.01)
*B81C 1/00* (2006.01)
*G01L 19/04* (2006.01)
*G01L 19/06* (2006.01)

(52) U.S. Cl.
CPC ........ *G01L 19/0618* (2013.01); *B81B 7/0032* (2013.01); *B81C 1/00261* (2013.01); *B81C 1/0069* (2013.01); *G01L 19/04* (2013.01)

(58) Field of Classification Search
CPC ..... G01L 9/06; G01L 9/0618; B81C 1/00261; B81C 1/00277; B81C 1/00285; B81B 7/0032; B81B 7/0035; B81B 7/0038
See application file for complete search history.

(56) References Cited

U.S. PATENT DOCUMENTS

| 5,189,777 | A | * | 3/1993 | Guckel ............... G01L 19/0618 430/324 |
| 6,127,744 | A | | 10/2000 | Streeter et al. |
| 6,160,230 | A | | 12/2000 | McMillan et al. |
| 2002/0055260 | A1 | | 5/2002 | Chow et al. |
| 2006/0075821 | A1 | | 4/2006 | Otsuka et al. |

(Continued)

FOREIGN PATENT DOCUMENTS

| CN | 85108071 A | 4/1986 |
| CN | 1910109 A | 2/2007 |

(Continued)

OTHER PUBLICATIONS

1st Office Action of counterpart Chinese Patent Application No. 202211151572.0 dated Oct. 31, 2022.

(Continued)

*Primary Examiner* — Herbert K Roberts

(57) ABSTRACT

The present application discloses a packaging structure and method of an MEMS pressure sensor. The packaging structure of the MEMS pressure sensor includes: a film, forming a sealing chamber with a base, during manufacturing the sealing chamber is internally equipped with a sensing medium and a pressure sensor chip, when the external pressure increases, the film bends towards an inner side of the sealing chamber to cause the sealing chamber to contract and transmit pressure to the pressure sensor chip through the sensing medium. The packaging structure of the present application can avoid the sensing chip from being damaged by excessive contraction of the sealing chamber due to pressure overload, and thus achieves overload protection.

10 Claims, 4 Drawing Sheets

(56) References Cited

U.S. PATENT DOCUMENTS

2007/0134835 A1    6/2007  Fukuda et al.
2020/0400523 A1*  12/2020  Takimoto .............. G01L 19/147

FOREIGN PATENT DOCUMENTS

| CN | 101710807 | A |   | 5/2010 |
|----|-----------|---|---|--------|
| CN | 103225651 | A |   | 7/2013 |
| CN | 103257007 | A | * | 8/2013 |
| CN | 103257007 | A |   | 8/2013 |
| CN | 208407725 | U |   | 1/2019 |
| CN | 212409938 | U | * | 1/2021 |
| CN | 112750804 | A |   | 5/2021 |
| SG |     64805 | A1|   | 5/1999 |

OTHER PUBLICATIONS

Notice of Allowance of counterpart Chinese Patent Application No. 202211151572.0 dated Nov. 24, 2022.
Jingliang Sui, Accuracy Improvement of Piezoresistive Flexible Pressure Sensors and Application, 2021, China Academic Journal Electronic Publishing House.

* cited by examiner

PACKAGING STRUCTURE AND METHOD OF MEMS PRESSURE SENSOR

CROSS-REFERENCE TO RELATED APPLICATIONS

The present application claims priority of Chinese Patent Application Nos. 202211151572.0 and 202211151573.5 filed on Sep. 21, 2022, which are hereby incorporated by reference in their entirety.

TECHNICAL FIELD

The present application belongs to the field of chip packaging technologies, and particularly relates to a packaging structure and method of an MEMS pressure sensor.

BACKGROUND

A packaging structure of an MEMS pressure sensor can not only protect a sensing chip from being interfered and damaged by an external environment, but also transmit an external pressure to be detected to the sensor chip to realize the detection of the pressure. Therefore, the packaging the MEMS pressure sensor has a significant influence on the performance of the sensor chip, and the quality of the structure thereof also directly affects application of the MEMS pressure sensor. At present, the packaging structure of the MEMS pressure sensor is simple in structure, but single in function, and does not have an additional gain effect on the sensor.

SUMMARY

The present application aims to provide a packaging structure and a packaging method of an MEMS pressure sensor, which can avoid damage to a sensing chip caused by excessive shrinkage of a sealing cavity due to pressure overload, thereby realizing overload protection. sealing chamber According to a first aspect of the present application, a packaging structure of an MEMS pressure sensor is provided, including:
 a film, forming a sealing chamber with a base, and the sealing chamber is internally equipped with a sensing medium and a pressure sensor chip, when the external pressure increases, the film bends towards an inner side of the sealing chamber to cause the sealing chamber to contract and transmit pressure to the pressure sensor chip through the sensing medium;
 a sealing cover, located on the base and suspended on one side of the film away from the sealing chamber; and
 a first electrode connected to the film and a second electrode connected to the sealing cover, wherein in a case that voltages access the sealing cover and the film through the corresponding electrodes, an electrostatic attraction is generated between the sealing cover and the film to balance an overloaded pressure.

Optionally, a cavity is formed in the base, and the film is located at an opening of the cavity to form the sealing chamber.

Optionally, the cavity is formed by a bottom plate and a side plate located on a surface of the bottom plate.

Optionally, the side plate includes concentrically located conductive inner shell and insulating outer shell; the film is located on the conductive inner shell and connected to the first electrode through the conductive inner shell; the sealing cover is located on the insulating outer shell.

Optionally, the insulating shell includes an inner shell and an outer shell, wherein the sealing cover is located at one end of the inner shell away from the bottom plate, and an end of the sealing cover facing the bottom plate is connected to the second electrode, the outer shell is located outside the inner shell, the sealing cover and the second electrode, wherein a gap between the outer shell and the inner shell, the cover, and the second electrode is filled with potting adhesive.

Optionally, the sealing cover includes a metal layer and an insulating layer covering an outer surface of the metal layer; the second electrode is specifically connected to the metal layer; and in a case that voltages access the metal layer and the film through the corresponding electrodes, an electrostatic attraction is generated between the metal layer and the film to balance an overloaded pressure.

Optionally, the sealing cover, the side plate and the film constitute a transition chamber; and a medium through hole communicating with the external is formed in the sealing cover.

Optionally, the bottom plate includes a first structural layer, a second structural layer, and an N-type semiconductor and a P-type semiconductor located between the first structural layer and the second structural layer; and the N-type semiconductor is connected with the P-type semiconductor in series and connected to a DC power supply.

Optionally, the film is a corrugated film.

Optionally, the sensing medium is one of air, water and silicone oil.

According to a second aspect of the present application a packaging method of an MEMS pressure sensor is provided, including:
 providing a bottom plate, wherein the bottom plate is provided with a first pin, a second pin, a first electrode and a second electrode in a penetrating manner;
 adhering a pressure sensor chip to a surface of the bottom plate, and connecting an input end and an output end of the pressure sensor chip with the first pin and the second pin respectively;
 mounting a side plate on the surface of the bottom plate to form a cavity;
 mounting a film at one end of the side plate away from the bottom plate, and connecting the film with the first electrode to form the sealing chamber, wherein the pressure sensor chip is located within the sealing chamber;
 filling the sealing chamber with a sensing medium;
 providing a sealing cover, wherein the sealing cover is provided with the second electrode; and
 suspending the sealing cover outside the film, fixing the sealing cover to the side plate, and disposing the second electrode on the bottom plate in a threaded manner.

Optionally, the bottom plate includes a first structural layer, a second structural layer, and an N-type semiconductor and a P-type semiconductor located between the first structural layer and the second structural layer; and the N-type semiconductor is connected with the P-type semiconductor in series and connected to a DC power supply.

The above-mentioned technical solution of the present application has the following beneficial effects:

The packaging structure of the MEMS pressure sensor in the present application is equipped with a sealing cover opposite to it outside the film. When pressure overload occurs, the film and the sealing cover can be connected to a voltage through their respective electrodes to generate electrostatic attraction between the two. This electrostatic attraction can be used to balance or offset the overload pressure, thereby achieving overload protection.

Figure 1:
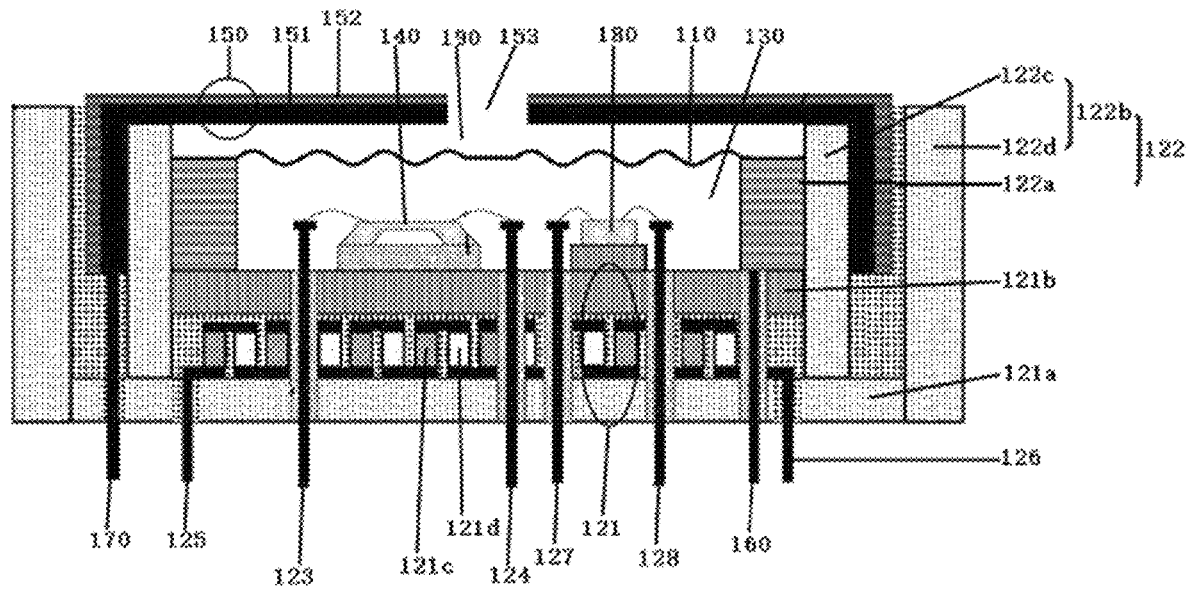
FIG. 1 is a schematic structural diagram of a packaging structure of an MEMS pressure sensor in one exemplary embodiment of the present application.
Figure 2:
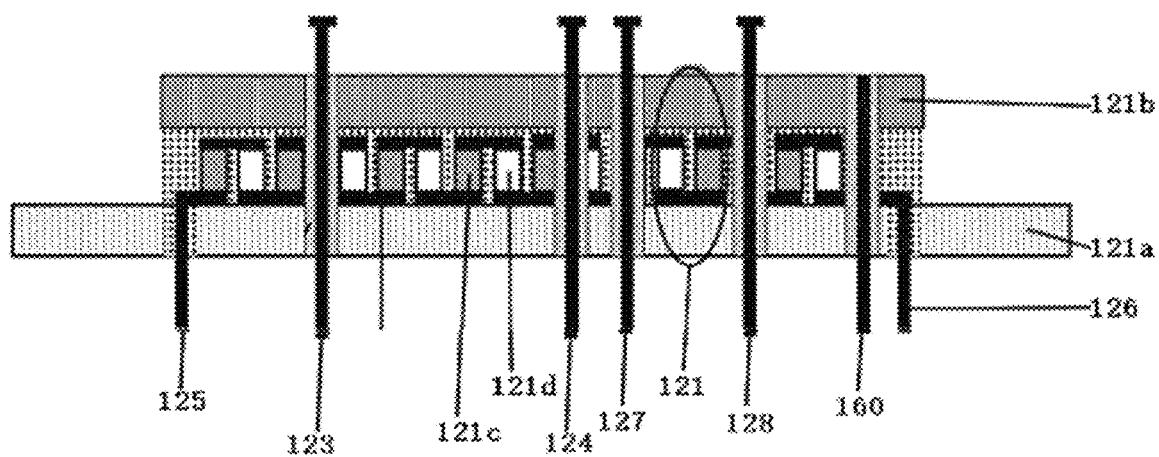
FIGS. 2-7 is a preparation process of a packaging structure of an MEMS pressure sensor in one exemplary embodiment of the present application.
Figure 3:
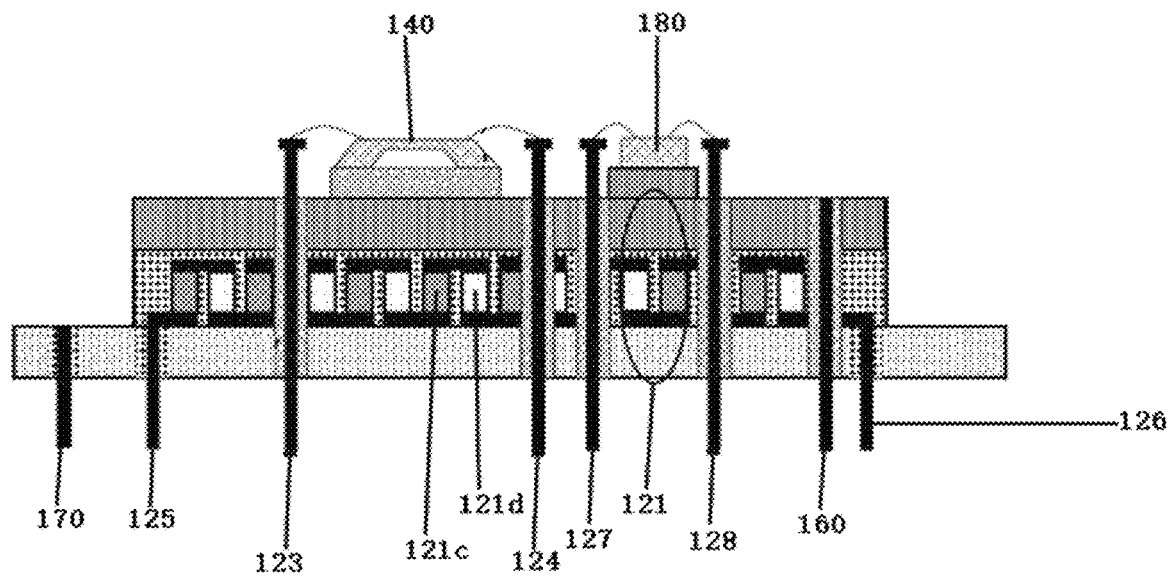
Figure 4:
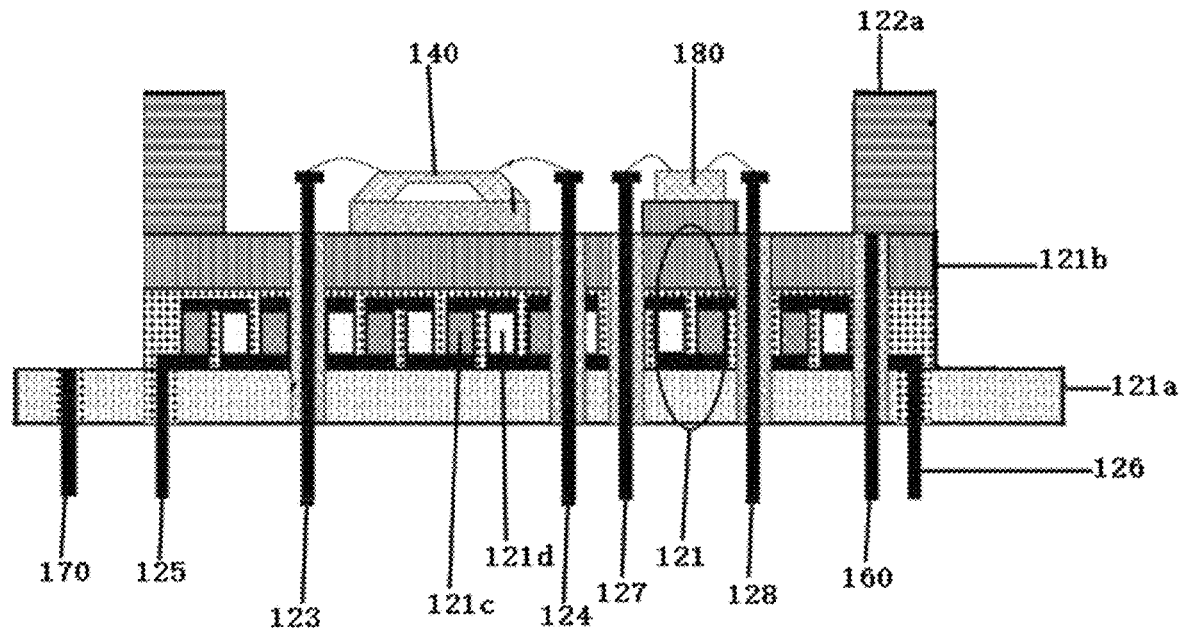
Figure 5:
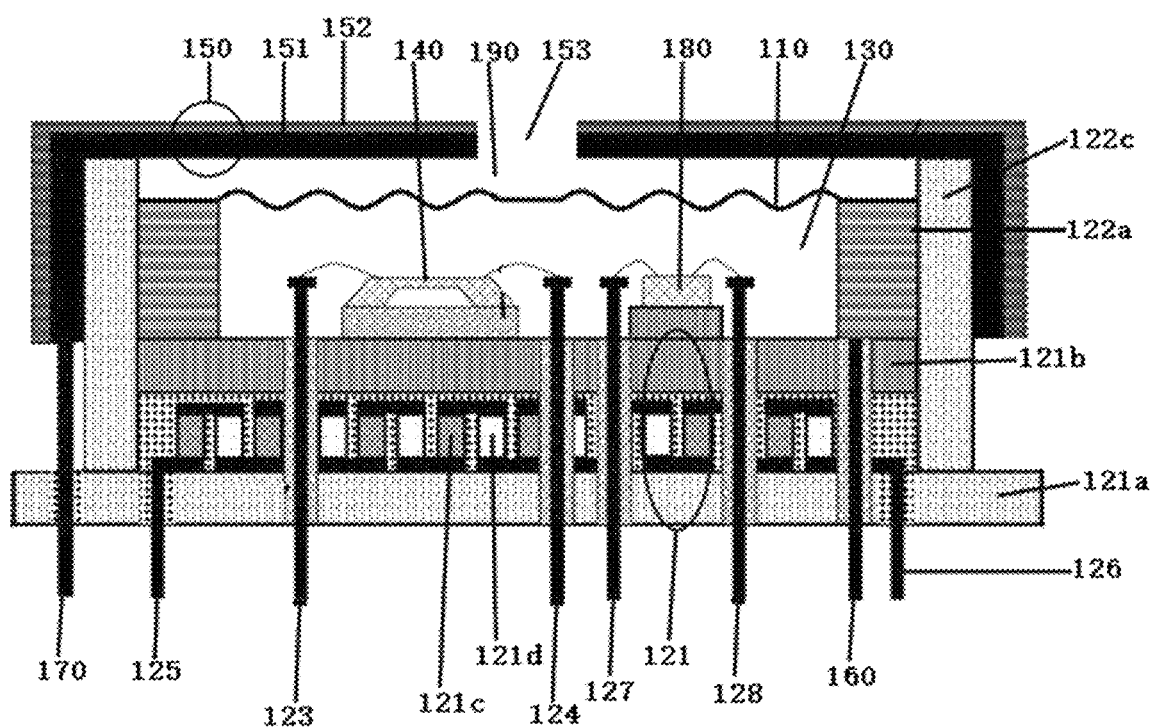
Figure 6:
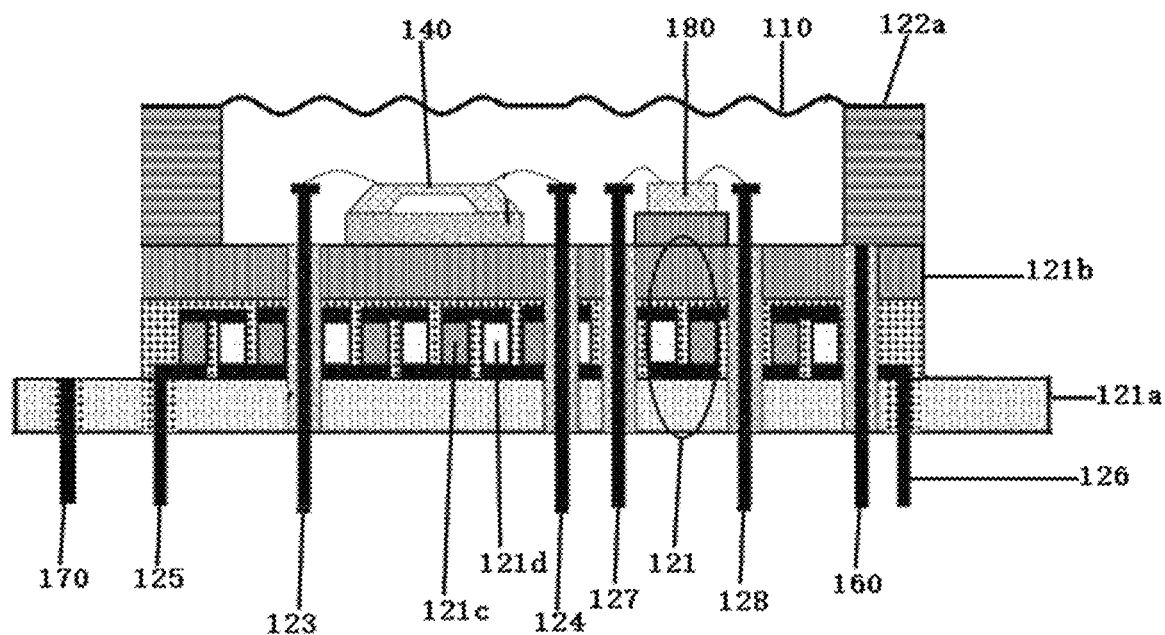
Figure 7:
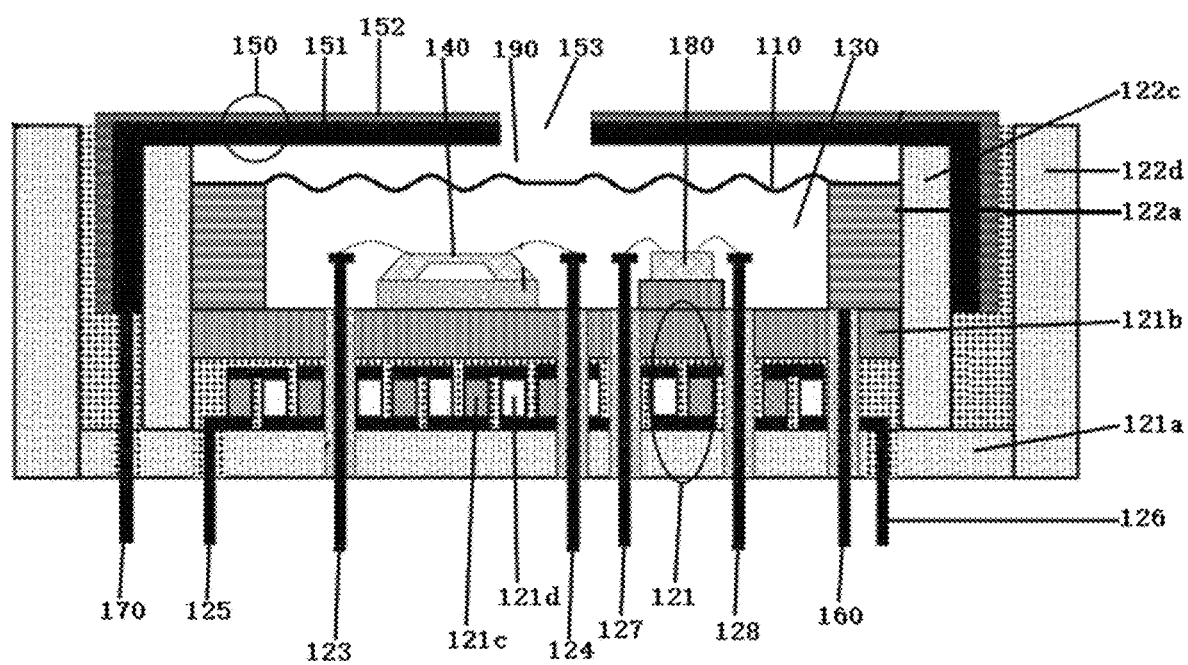

Reference numerals in the drawings: 110. film; 121. bottom plate; 121a. first structural layer; 121b. second structural layer; 121c.N-type semiconductor; 121d. P-type semiconductor; 122. side plate; 122a. conductive inner shell; 122b. insulating outer shell; 122c. inner shell; 122d. outer shell; 123. first pin; 124. second pin; 125. third pin; 126. fourth pin; 127. fifth pin; 128. sixth pin; 130. sealing chamber; 140. pressure sensor; 150. sealing cover; 151. metal layer; 152. insulating layer; 153. medium through hole; 160. first electrode; 170. second electrode; 180. temperature sensor chip; and 190. transition chamber.

DETAILED DESCRIPTION OF THE EMBODIMENTS

In order to make the objective, technical solutions and advantages of the present application clearer, the present application will be described in further detail below in conjunction with the specific implementations with reference to the accompanying drawings. It should be understood that these descriptions are examples only, and are not intended to limit the scope of the present application. In addition, in the following description, descriptions of well-known structures and techniques are omitted to avoid unnecessarily obscuring the concepts of the present application.

In the description of the present application, it should be noted that the terms "first", "second" and "third" are merely for descriptive purposes cannot not be understood as indication or implication of relative importance.

Moreover, the technical features involved in different embodiments of the present application described below can be combined with each other as long as they do not conflict with each other.

As shown in FIG. 1, the embodiment of the present application provides a packaging structure of an MEMS pressure sensor 140, including: a film 110, forming a sealing chamber 130 with a base (not shown in the drawing), where the sealing chamber 130 is internally equipped with a sensing medium and a pressure sensor chip and when the external pressure increases, the film 110 bends towards an inner side of the sealing chamber 130, so as to cause the sealing chamber 130 contract and transmit pressure to the pressure sensor chip through the sensing medium; a sealing cover 150, located on the base and suspended on one side of the film 110 away from the sealing chamber 130; a first electrode 160 connected to the film 110 and a second electrode 170 connected to the sealing cover 150, where in a case that voltages access the sealing cover 150 and the film 110 through the corresponding electrodes, an electrostatic attraction is generated between the sealing cover 150 and the film 110 to balance an overloaded pressure.

Specifically, both the film 110 and the sealing cover 150 are conductive and become charged bodies with opposite electrical properties after voltages access the film 110 and the cover 150 through the first electrode 160 and the second electrode 170 from the electrostatic attraction between the two. The electrostatic attraction causes the film 110 to expand outward and counteract or balance the overloaded pressure, so as to achieve overload protection. Optionally, the first electrode 160 and the second electrode 170 are only energized during pressure overload, and can be adapted to different overloaded pressures by applying different voltages. For example, a magnitude of the voltage introduced can be determined through a negative feedback circuit. Meanwhile, the sealing cover 150 also has a protective effect on the film 110, which can avoid possible damage to the film 110 during transportation and use, thereby reducing the risk of device damage.

The packaging structure of the MEMS pressure sensor 140 in the embodiment of the present application is provided with the sealing cover 150 outside the film 110. If there is the pressure overload, the voltage can access the film 110 and the sealing cover 150 through the corresponding electrodes, so as to generate the electrostatic attraction between the film 110 and the sealing cover 150. The electrostatic attraction can be used to balance or counteract the overloaded pressure, thereby achieving overload protection.

In some optional embodiments, a cavity is formed in the base, and the film 110 is located at the cavity opening to form a sealing chamber 130.

In some optional embodiments, the cavity is formed by a bottom plate 121 and a side plate 122 located on a surface of the bottom plate 121, where the side plate 122 can be of a tubular structure, for example, a circular tube, a square tube, etc. By fixing one end of the side plate 122 to one side of the bottom plate 121, the cavity can be formed; and the film 110 is packaged at the other end of the side plate 122. In specific implementation, the shape of the side plate 122 can be flexibly designed by those skilled in the art according to the actual situation. In the present embodiment, the side plate 122 is preferably of a circular tubular structure.

In some optional embodiments, the first electrode 160 and the second electrode 170 are both threaded on the bottom plate 121. The side plate 122 includes concentrically located conductive inner shell 122a and insulating outer shell 122b; the film 110 is located on the conductive inner shell 122a, and connected with the first electrode 160 through the conductive inner shell 122a; and the sealing cover 150 is located on the insulating outer shell 122b. In specific implementation, mounting the film 110 and the sealing cover 150 through the conductive inner shell 122a and the insulating outer shell 122b respectively can avoid conductive connection there between and make an overload protection function fail. Moreover, compared with directly connecting the first electrode 160 with the film 110, connecting the first electrode 160 to the film 110 through the conductive inner shell 122a is easier, and facilitates packaging of the sensor. Further, in order to make the sealing cover 150 suspended outside the film 110, the insulating outer shell 122b can have a larger height than the conductive inner shell 122a. For example, the film 110 is located at one end of the conductive inner shell 122a away from the bottom plate 121, and the sealing cover 150 is located at one end of the insulating inner shell 122b away from the bottom plate 121.

In some optional embodiments, in order to avoid externally exposing the second electrode 170, the insulating outer shell 122b includes an inner shell 122c and an outer shell 122d. The sealing cover 150 is located at one end of the inner shell 122c away from the bottom plate 121, and an end of sealing cover 150 facing the bottom plate is connected to the second electrode 170. The outer shell 122d is located outside the inner shell 122c, the sealing cover 150 and the second electrode 170, wherein a gap between the outer shell 122*d* and the inner shell 122*c*, the sealing cover 150, and the second electrode 170 is filled with sealing adhesive. In specific implementation, the second electrode 170 is connected to one end of the sealing cover 150 facing the bottom plate 121, and located on an outer side of the inner shell 122*c*. By arranging a layer of outer shell 122*d* outside the inner shell 122*c* and the second electrode 170 can avoid the second electrode 170 from being externally exposed.

In some optional embodiments, the sealing cover 150 includes a metal layer 151 and an insulating layer 152 covering an outer surface of the metal layer 151. In specific implementation, the second electrode 170 is specifically connected to the metal layer 151; in a case that voltages access the metal layer 151 and the film 110 through the corresponding electrodes, an electrostatic attraction is generated between the metal layer 151 and the film 110 to balance an overloaded pressure; and meanwhile, the insulating layer 152 can protect the metal layer 151 and avoid the pressure sensor 140 from being damaged during transportation, manufacturing and use.

In some optional embodiments, the sealing cover 150, the side plate 122 and the film 110 constitute a transition chamber 190; and a medium through hole 153 communicating with the external is formed in the sealing cover 150.

In some optional embodiments, the used film 110 is a corrugated film. The corrugated film has good elasticity, which can be used to transfer a pressure and release a thermal stress, where a thickness of the corrugated film is related to a required compressive strength. The greater the thickness of the corrugated film is, the higher the hardness is, and the greater the stiffness of the corrugated film is, which causes the corrugated film more prone to fatigue damage. However, if the thickness is too small and the hardness is too weak, the compressive strength of the corrugated film will be reduced. In specific implementation, the thickness and the compressive strength of the corrugated film can be flexibly designed by those skilled in the art according to the actual situation.

In some optional embodiments, the sensing medium is one of air, water and silicone oil. In the present embodiment, the sensing medium is preferably silicone oil. As having good inertia and pressure transmission ability, silicone oil can be used to protect the pressure sensor 140 chip and efficiently transmit the external pressure being detected. In specific implementation, an oil injection hole can be formed in the bottom plate 121, silicone oil is injected into the sealing chamber 130 using the oil injection hole; and after injection of the silicone oil is completed, a filling hole is sealed the potting adhesive.

In some optional embodiments, the pressure sensor chip is adhered to the base through a glass substrate.

In some optional embodiments, the first electrode 160, the second electrode 170 and pins connecting to the pressure sensor chip are all threaded on the bottom plate 121. Exemplarily, the pins include a first pin 123 and a second pin 124. The first pin 123 and the second pin 124 are connected to an input end and an output end of the pressure sensor chip respectively for outputting a pressure signal. In other embodiments, the sealing chamber 130 can further be provided with other sensing chips inside, for example, a temperature sensor chip 180, and the temperature sensor chip 180 is adhered to the bottom plate 121 through a glass substrate. During pressure detection, the pressure sensor 140 can detect a temperature in the sealing chamber 130 through the temperature sensor chip 180. Correspondingly, the bottom plate 121 can further be provided with other threaded pins to be connected to the temperature sensor chip 180 to output a temperature signal.

In some optional embodiments, the film 110 and the sealing cover 150 may be designed with the corresponding electrodes integrally or separately. For example, the film 110 and the first electrode 160 are designed separately, can be mounted to the conductive inner shell 122*a* and the bottom plate 121 successively, and are connected through the conductive inner shell 122*a*. For another example, the sealing cover 150 is integrated with the second electrode 170. While the sealing cover 150 is mounted, the second electrode 170 can be threaded through a hole formed in the bottom plate 121.

In some optional embodiments, the bottom plate 121 includes a first structural layer 121*a*, a second structural layer 121*b*, an N-type semiconductor 121*c* and a P-type semiconductor 121*d* located between the first structural layer 121*a* and the second structural layer 121*b*. The N-type semiconductor 121*c* is connected in series with the P-type semiconductor 121*d* and connected to a DC power supply. Specifically, the N-type semiconductor 121*c* and P-type semiconductor 121*d* are connected in series through a metal wire, and connected to the peripheral DC power supply through pins. In specific implementation, the N-type semiconductor 121*c* is insulated and isolated from the P-type semiconductor 121*d* through potting adhesive. Similarly, the N-type semiconductor 121*c* and the P-type semiconductor 121*d* are insulated and isolated from other metal elements, except the metal wire, through the potting adhesive. For example, the first structural layer 121*a* is a metal material layer, the second structural layer 121*b* is an insulating material layer, and the N-type semiconductor 121*c* and the P-type semiconductor 121*d* are insulated and isolated from the first structural layer 121*a* through the potting adhesive. In specific implementation, the series structure of N-type semiconductor 121*c* and P-type semiconductor 121*d* can generate Peltier effect after being energized, causing heat transfer between the first structural layer 121*a* and the second structural layer 121*b*. For example, in a case that a current is input from the N-type semiconductor 121*c*, heat of the first structural layer 121*a* is transferred to the second structural layer 121*b*; and in a case that a current is input from the P-type semiconductor 121*d*, heat of the second structural layer 121*b* is transferred to the first structural layer 121*a*. Thus, it is possible to control the internal temperature of the sealing chamber 130 and avoid the problem of sensor chip performance drift caused by environmental temperature changes.

In some optional embodiments, a temperature sensor chip 180 is installed inside the sealing chamber 130 to detect the temperature inside the sealing chamber 130, and the detected temperature can serve as a parameter basis for temperature control.

As shown in FIGS. 2-7, an embodiment of the present application further provides a packaging method of an MEMS pressure sensor 140, including:

Step 1, providing a bottom plate 121, where the bottom plate 121 is provided with a first pin 123, a second pin 124, a first electrode 160 and a second electrode 170 in a threaded manner.

Specifically, the first pin 123 and the second pin 124 are used to being respectively connected to an input end and an output end of a pressure sensor chip to output a signal. The first electrode 160 and the second electrode 170 are used to being respectively connecting to the film 110 and the sealing cover 150 to cause voltage access the film 110 and the sealing cover 150, thus the film 110 and the sealing cover 150 become charged bodies with opposite electrical properties, so that an electrostatic attraction is generated between the film 110 and the sealing cover 150.

In specific implementation, the bottom plate 121 may be formed by a first structural layer 121a, a second structural layer 121b, an N-type semiconductor 121c and a P-type semiconductor 121d located between the first structural layer 121a and the second structural layer 121b. The N-type semiconductor 121c and the P-type semiconductor 121d are connected in series through a metal wire. The series structure of N-type semiconductor 121c and P-type semiconductor 121d can generate Peltier effect after being energized, causing heat transfer between the first structural layer 121a and the second structural layer 121b. Correspondingly, the bottom plate 121 is further provided with a third pin 125 and a fourth pin 126. The third pin 125 and the fourth pin 126 are connected to two ends of the series structure formed by the N-type semiconductor 121c and the P-type semiconductor 121d respectively.

In specific implementation, both N-type semiconductor 121c and P-type semiconductor 121d are multiple, and multiple N-type semiconductors 121c and multiple P-type semiconductors 121d are connected in series through metal wires. As the number of N-type semiconductors 121c and P-type semiconductors 121d in series increases, their heat absorption and release efficiency also increases accordingly.

In specific implementation, preparation steps of the bottom plate 121 are as follows: providing a first structural layer 121a with through holes, where the through holes include a first through hole, a second through hole, a third through hole, and a fourth through hole; arranging and adhering metal wires on a surface of the first structural layer 121a in a direction parallel to the surface of the first structural layer 121a; arranging the first pin 123, the second pin 124, the third pin 125 and the fourth pin 126 in the first through hole, the second through hole, the third through hole and the fourth through hole correspondingly, where each of the first pin 123 and the second pin 124 is provided with an insulator in a sleeved manner; adhering one N-type semiconductor 121c and one P-type semiconductor 121d to two ends of each metal wire respectively, and connecting the N-type semiconductor 121c at one end to the third pin 125 and connecting the P-type semiconductor 121d at the other end to the fourth pin 126 in an arrangement direction; adhering a metal wire to adjacent and unconnected N-type semiconductors 121c and P-type semiconductors 121d in an arrangement direction to connect the plurality of N-type semiconductors 121c and P-type semiconductors 121d in series; providing a second structure layer 121b with a through hole, suspending the second structure layer 121b above the first structure layer 121a, the N-type semiconductors 121c and the P-type semiconductors 121d, and enabling the first pin 123 and the second pin 124 to be threaded through the through hole on the second structure layer 121b; and filling potting adhesive between the first structural layer 121a and the second structural layer 121b as well as the N-type semiconductors 121c and the P-type semiconductors 121d to form a plate.

Step 2, adhering a pressure sensor chip to a surface of the bottom plate 121, and connecting the input end and output end of the pressure sensor chip to the first pin 123 and the second pin 124 respectively.

In specific implementation, the first structural layer 121a is a ceramic plate, the second structural layer 121b is a Kovar alloy plate, and the pressure sensor chip can be adhered to the second structural layer 121b through a glass substrate.

In specific implementation, the temperature sensor chip 180 can further be adhered to the surface of the bottom plate 121. Correspondingly, pins connected to the temperature sensing chip 180 and used for signal output can also be set on the base plate 121. For example, the bottom plate 121 is provided with the fifth pin 127 and the sixth pin 128 in a threaded manner; and after the temperature sensor chip 180 is adhered, the input end and the output end of the temperature sensor chip 180 are connected to the fifth pin 127 and the sixth pin 128 respectively.

Step 3, mounting a side plate 122 on a surface of the bottom plate 121 to form a cavity.

In specific implementation, the side plate 122 can be of a tubular structure, for example, a circular tube, a square tube, etc. By fixing one end of the side plate 122 to one side of the bottom plate 121, the cavity may be formed; and the film 110 is packaged at the other end of the side plate 122. The shape of the side plate 122 can be flexibly designed by those skilled in the art according to the actual situation. In the present embodiment, the side plate 122 is preferably of a circular tubular structure.

In specific implementation, the side plate 122 includes concentrically located conductive inner shell 122a and insulating outer shell 122b; and the conductive inner shell 122a and the insulating outer shell 122b are successively mounted on the surface of the bottom plate 121, where the side plate 122 specifically forms the cavity with the bottom plate 121 by the conductive inner shell 122a; and in addition, the conductive inner shell 122a is further connected to the first electrode 160.

Step 4, mounting the film 110 at one end of the side plate 122 away from the bottom plate 121, and connecting the film 110 to the first electrode 160 to form the sealing chamber 130, where the pressure sensor chip is located within the sealing chamber 130.

In specific implementation, the film 110 is a corrugated film which has good elasticity and can be used to transmit pressure and release thermal stress.

In specific implementation, the film 110 is located at one end of the conductive inner shell 122a away from the bottom plate 121, and connected to the first electrode 160 by the conductive inner shell 122a. Compared to directly connecting the first electrode 160 to the membrane 110, connecting the first electrode 160 to the membrane 110 through the conductive inner shell 122a reduces the difficulty and facilitates the packaging of the sensor.

Step 5, filling the sealing chamber 130 with a sensing medium.

In specific implementation, the sensing medium is one of air, water and silicone oil. In the present embodiment, the sensing medium is preferably silicone oil. Silicone oil has good inertness and pressure transmission ability, which can be used to protect the pressure sensor 140 chip and efficiently transmit the external pressure to be detected. In addition, in order to fill the sealing chamber 130 with the sensing medium, an oil injection hole can be formed in the bottom plate 121; silicone oil is injected into the sealing chamber 130 using the oil injection hole; and after injection of the silicone oil is completed, a filling hole is sealed by potting adhesive.

Step 6, providing the sealing cover 150, where the sealing cover 150 is provided with the second electrode 170. As shown in the drawing, the second electrode 170 is connected to an axial end of the sealing cover 150.

In specific implementation, the sealing cover 150 includes a metal layer 151 and an insulating layer 152 covering an outer surface of the metal layer 151, where the metal layer 151 is used to be connected to the second electrode 170 and accessing a voltage through the second electrode 170, so that an electrostatic attraction is generated between the metal layer 151 and the film 110 to balance an overloaded pressure. And as covering the outer surface of the metal layer 151, the insulating layer 152 can protect the metal layer 151 and avoid the pressure sensor 140 from being damaged during transportation, manufacturing and use. Specifically, the sealing cover 150 is made of hard material, for example, the sealing cover 150 can be made of metal material, plastic material, etc.

In specific implementation, the sealing cover 150 is sleeved at one end of the side plate 122 away from the bottom plate 121, and forms a transition chamber 190 with the film 110 and the side plate 122. In order to ensure that an external pressure can act on the film 110, a medium through hole 153 communicating with the external is formed in the sealing cover 150.

Step 7, suspending the sealing cover 150 outside the film 110, fixing the sealing cover 150 to the side plate 122, and disposing the second electrode 170 on the bottom plate 121 in a threaded manner.

In specific implementation, the sealing cover 150 is sleeved at one end of the insulating outer shell 122b away from the bottom plate 121; and the film 110 and the sealing cover 150 are respectively installed through the conductive inner shell 122a and the insulating shell 122b, which can avoid conductive connection between the two and make the overload protection function ineffective. Further, in order to avoid externally exposing the second electrode 170, the insulating outer shell 122b can be designed as the inner shell 122c and the outer shell 122d. During manufacturing, the inner shell 122c can be first sleeved outside the conductive inner shell 122a, then the sealing cover 150 is sleeved on the inner shell 122c, and the second electrode 170 threaded into the through hole on the bottom plate 121; then the outer shell 122d is sleeved outside the conductive inner shell 122a and the sealing cover 150. In addition, gaps between the outer shell 122d and the inner shell 122c as well as the sealing cover 150 and the second electrode 170 are further filled with a potting adhesive.

As shown in FIGS. 2-7, an embodiment of the present application further provides a packaging method of an MEMS pressure sensor 140, including:

Step 1, providing a bottom plate 121, where the bottom plate 121 includes a first structural layer 121a, a second structural layer 121b, and an N-type semiconductor 121c and a P-type semiconductor 121d located between the first structural layer 121a and the second structural layer 121b; the N-type semiconductor 121c is connected in series with the P-type semiconductor 121d through a metal wire; the first structure layer 121a and the second structure layer 121b are provided with a first pin 123 and a second pin 124 in a threaded manner; the first structure layer 121a is provided with a third pin 125 and a fourth pin 126 in a threaded manner; and the third pin 125 and the fourth pin 126 are connected to two ends of the series structure formed by the N-type semiconductor 121c and the P-type semiconductor 121d respectively, which are used to be connected to the DC power supply.

Specifically, N-type semiconductor 121c and P-type semiconductor 121d can generate the Peltier effect after being connected in series and energized, causing heat transfer between the first structural layer 121a and the second structural layer 121b. For example, in a case that a current is input from the N-type semiconductor 121c, heat of the first structural layer 121a is transferred to the second structural layer 121b; and in a case that a current is input from the P-type semiconductor 121d, heat of the second structural layer 121b is transferred to the first structural layer 121a. Thus, this packaging method can achieve control of the internal temperature of the sealing chamber 130 and avoid the problem of sensor chip performance drift caused by environmental temperature changes.

In specific implementation, the first structural layer 121a is a ceramic plate, the second structural layer 121b is a Kovar alloy plate, and the pressure sensor chip can be adhered to the first structural layer 121a by a glass substrate.

In specific implementation, both N-type semiconductor 121c and P-type semiconductor 121d are multiple, and multiple N-type semiconductors 121c and multiple P-type semiconductors 121d are connected in series through metal wires. As the number of N-type semiconductors 121c and P-type semiconductors 121d in series increases, their heat absorption and release efficiency also increases accordingly.

In specific implementation, preparation steps of the bottom plate 121 are as follows: providing a first structural layer 121a with through holes, where the through holes include a first through hole, a second through hole, a third through hole, and a fourth through hole; arranging and adhering metal wires on a surface of the first structural layer 121a in a direction parallel to the surface of the first structural layer 121a; arranging the first pin 123, the second pin 124, the third pin 125 and the fourth pin 126 in the first through hole, the second through hole, the third through hole and the fourth through hole correspondingly, where each of the first pin 123 and the second pin 124 is provided with an insulator in a sleeved manner; adhering one N-type semiconductor 121c and one P-type semiconductor 121d to two ends of each metal wire respectively, and connecting the N-type semiconductor 121c at one end to the third pin 125 and connecting the P-type semiconductor 121d at the other end with the fourth pin 126 in an arrangement direction; adhering a metal wire to adjacent and unconnected N-type semiconductor 121c and P-type semiconductor 121d in an arrangement direction, to connect the plurality of N-type semiconductors 121c and the plurality of P-type semiconductors 121d in series; providing a second structure layer 121b with a through hole, suspending the second structure layer 121b above the first structure layer 121a, the N-type semiconductors 121c and the P-type semiconductors 121d, and enabling the first pin 123 and the second pin 124 to be threaded through the through hole on the second structure layer 121b; and filling potting adhesive between the first structural layer 121a and the second structural layer 121b as well as the N-type semiconductors 121c and the P-type semiconductors 121d to form a plate.

Step 2, adhering a pressure sensor chip to one side of the second structural layer 121b away from the first structural layer 121a, and connecting an input end and an output end of the pressure sensor chip to the first pin 123 and the second pin 124 respectively.

In specific implementation, a temperature sensor chip 180 may further be adhered to one side of the second structural layer 121b away from the first structural layer 121a; and correspondingly, pins connected with the temperature sensor chip 180 and used for outputting a signal may further be located on the bottom plate 121. For example, the first structural layer 121a and the second structural layer 121b are provided with the fifth pin 127 and the sixth pin 128 in a threaded manner; and after the temperature sensor chip 180 is adhered, the input end and the output end of the temperature sensor chip 180 are connected to the fifth pin 127 and the sixth pin 128 respectively.

Step 3, mounting a side plate 122 on one side of the second structural layer 121b away from the first structural layer 121a to form a cavity.

In specific implementation, the side plate 122 can be of a tubular structure, for example, a circular tube, a square tube, etc. By fixing one end of the side plate 122 to one side of the bottom plate 121, the cavity can be formed; and the film 110 is packaged at the other end of the side plate 122. A shape of the side plate 122 can be flexibly designed by those skilled in the art according to the actual situation. In the present embodiment, the side plate 122 is preferably of a circular tubular structure.

Step 4, mounting the film 110 at one end of the side plate 122 away from the bottom plate 121 to form the sealing chamber 130, where the pressure sensor chip is located within the sealing chamber 130.

In specific implementation, the film 110 is a corrugated film which has good elasticity and can be used to transmit pressure and release thermal stress.

Step 5, filling the sealing chamber 130 with a sensing medium.

In specific implementation, the sensing medium one of air, water and silicone oil. In the present embodiment, the sensing medium is preferably silicone oil. Silicone oil has good inertness and pressure transmission ability, which can be used to protect the pressure sensor chip 140 and efficiently transmit the external pressure to be detected. In specific implementation, an oil injection hole can be provided on the bottom plate 121 to inject silicone oil into the sealing chamber 130. After the silicone oil injection is completed, the hole can be sealed and filled with potting adhesive.

Step 6, providing the sealing cover 150, where the sealing cover 150 is suspended outside the film 110, and fixed to the side plate 122 to protect the film 110.

In specific implementation, the film 110 may be damaged during transportation and use. By setting the sealing cover 150 outside the film 110, the risk of device damage can be reduced. Specifically, the sealing cover 150 is made of hard material, such as metal, plastic, etc.

Where the sealing cover 150 is sleeved at one end of the side plate 122 away from the second structural layer 121b, and forms a transition chamber 190 with the film 110 and the side plate 122. In order to ensure that an external pressure can act on the film 110, a medium through hole 153 communicating with the external is formed in the sealing cover 150.

Where the film 110 can be a conductor, for example, the sealing cover 150 includes a metal layer 151 and an insulating layer 152 covering an outer surface of the metal layer 151. The film 110 and the sealing cover 150 become charged bodies with opposite electrical properties after voltages access the film 110 and the sealing cover 150, thereby generating the electrostatic attraction there between. The electrostatic attraction causes the film 110 to expand outward and then counteract or balance the overloaded pressure, so as to achieve overload protection. Correspondingly, electrodes connected to the film 110 and the sealing cover 150 may be configured, for example, the bottom plate 121 is provided with a first electrode 160; when the film 110 is mounted, the first electrode 160 is connected to the film 110, and the second electrode 170 is connected to the sealing cover 150; and when the sealing cover 150 is mounted, the second electrode 170 is threaded into the through hole of the bottom plate 121. In order to avoid the film 110 from contacting to the sealing cover 150, which causes the overload protection function fail, the side plate 122 may be designed as concentrically located conductive inner shell 122a and insulating outer shell 122b. During manufacturing, the conductive inner shell 122a is first mounted, and the film 110 is mounted at one end of the conductive inner shell 122a away from the bottom plate 121, and the film 110 is connected to the first electrode 160 through the conductive inner shell 122a; and then the insulating outer shell 122b is mounted, and the sealing cover 150 is mounted at one end of the insulating outer shell 122b away from the bottom plate 121. The film 110 and the sealing cover 150 are mounted through the conductive inner shell 122a and the insulating outer shell 122b respectively, which can avoid conductive connection between the film 110 and the sealing cover 150, and cause the overload protection function fail. Moreover, compared with directly connecting the first electrode 160 with the film 110, connecting the first electrode 160 with the film 110 through the conductive inner shell 122a is easier, and facilitates packaging of the sensor. Furthermore, in order to avoid exposing the second electrode 170 to the outside, the insulating shell 122b can be designed as an inner shell 122c and an outer shell 122d. During the production process, the inner shell 122c can be first sheathed outside the conductive inner shell 122a, and then the sealing cover 150 can be sheathed on the inner shell 122c, and the second electrode 170 can be threaded into the through hole on the bottom plate 121. Subsequently, the outer shell 122d can be sheathed outside the conductive inner shell 122a and the sealing cover 150. In addition, the gap between the outer shell 122d and the inner shell 122c, the sealing cover 150, and the second electrode 170 can also be filled with spotting adhesive.

The embodiments of the present application are described above in combination with the accompanying drawings. However, the present application is not limited to the above specific implementations; and the above specific implementations are merely meant to be illustrative and not limiting. Those of ordinary skill in the art may, under the inspiration of the present application, further make various forms, which all fall within protection of the present application, without departing from the spirit of the present application and the protection scope defined by the appended claims.

What is claimed is:

1. A packaging structure of an MEMS pressure sensor, including:
   a film, forming a sealing chamber with a base, wherein the sealing chamber is internally equipped with a sensing medium and a pressure sensor chip, when the external pressure increases, the film bends towards an inner side of the sealing chamber to cause the sealing chamber to contract and transmit pressure to the pressure sensor chip through the sensing medium;
   a sealing cover, located on the base and suspended on one side of the film away from the sealing chamber, and
   a first electrode connected to the film and a second electrode connected to the sealing cover, wherein in a case that voltages access the sealing cover and the film through the corresponding electrodes, an electrostatic attraction is generated between the sealing cover and the film to balance an overloaded pressure.

2. The packaging structure of the MEMS pressure sensor according to claim 1, wherein a cavity is formed in the base, and the film is located at an opening in the cavity to form the sealing chamber.

3. The packaging structure of the MEMS pressure sensor according to claim 2, wherein the cavity is formed by a bottom plate and a side plate located on a surface of the bottom plate.

4. The packaging structure of the MEMS pressure sensor according to claim 3, wherein the first electrode and the second electrode are threaded on the bottom plate, the side plate includes concentrically located conductive inner shell and insulating outer shell; the film is located on the conductive inner shell, and connected to the first electrode through the conductive inner shell; and the sealing cover is located on the insulating outer shell.

5. The packaging structure of the MEMS pressure sensor according to claim 4, wherein the insulating outer shell includes an inner shell and an outer shell; the sealing cover is located at one end of the inner shell away from the bottom plate, and one end of the sealing cover facing the bottom plate is connected to the second electrode, the outer shell is located outside the inner shell, the sealing cover and the second electrode, wherein a gap between the outer shell and the inner shell, the cover, and the second electrode is filled with potting adhesive.

6. The packaging structure of the MEMS pressure sensor according to claim 1, wherein the sealing cover includes a metal layer and an insulating layer covering an outer surface of the metal layer; the second electrode is specifically connected to the metal layer; and in the case that the voltages access the metal layer and the film through the corresponding electrodes, the electrostatic attraction is generated between the metal layer and the film to balance the overloaded pressure.

7. The packaging structure of the MEMS pressure sensor according to claim 3, wherein the sealing cover, the side plate and the film constitute a transition chamber; and a medium through hole communicating with the external is formed within the sealing cover.

8. The packaging structure of the MEMS pressure sensor according to claim 1, wherein the film is a corrugated film.

9. The packaging structure of the MEMS pressure sensor according to claim 1, wherein the sensing medium is one of air, water and silicone oil.

10. The packaging structure of the MEMS pressure sensor according to claim 3, wherein the bottom plate includes a first structural layer, a second structural layer, and an N-type semiconductor and a P-type semiconductor located between the first structural layer and the second structural layer; and the N-type semiconductor is connected in series with the P-type semiconductor and connected to a DC power supply.

* * * * *